US008588008B2

(12) United States Patent
Cornwell

(10) Patent No.: US 8,588,008 B2
(45) Date of Patent: Nov. 19, 2013

(54) INTERLEAVING CHARGE PUMPS FOR PROGRAMMABLE MEMORIES

(75) Inventor: Michael J. Cornwell, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/524,862

(22) Filed: Jun. 15, 2012

(65) Prior Publication Data

US 2012/0250422 A1  Oct. 4, 2012

Related U.S. Application Data

(60) Continuation of application No. 13/188,302, filed on Jul. 21, 2011, now Pat. No. 8,203,892, which is a continuation of application No. 12/510,935, filed on Jul. 28, 2009, now Pat. No. 7,986,568, which is a division of application No. 11/686,084, filed on Mar. 14, 2007, now Pat. No. 7,613,051.

(51) Int. Cl.
*G11C 5/14* (2006.01)

(52) U.S. Cl.
USPC ............... 365/189.09; 365/206; 365/185.11; 365/185.05

(58) Field of Classification Search
USPC ............... 365/189.08, 206, 185.11, 185.05, 365/189.09, 185.23, 189.11, 203, 204, 365/210.12, 227, 229, 230.03
See application file for complete search history.

(56) References Cited

U.S. PATENT DOCUMENTS

| 5,602,987 | A | 2/1997 | Harari et al. |
| 5,671,229 | A | 9/1997 | Harari et al. |
| 5,719,808 | A | 2/1998 | Harari et al. |
| 6,088,264 | A | 7/2000 | Hazen et al. |
| 6,149,316 | A | 11/2000 | Harari et al. |
| 6,275,096 | B1 | 8/2001 | Hsu et al. |
| 6,278,317 | B1 | 8/2001 | Hsu et al. |
| 6,385,107 | B1 | 5/2002 | Bedarida et al. |
| 6,426,893 | B1 | 7/2002 | Conley et al. |
| 6,577,535 | B2 | 6/2003 | Pasternak |
| 6,721,820 | B2 | 4/2004 | Zilberman et al. |
| 6,757,842 | B2 | 6/2004 | Harari et al. |
| 6,763,424 | B2 | 7/2004 | Conley |
| 6,836,176 | B2 | 12/2004 | Zeng et al. |
| 6,914,846 | B2 | 7/2005 | Harari et al. |
| 6,947,332 | B2 | 9/2005 | Wallace et al. |
| 6,967,523 | B2 | 11/2005 | Demone |
| 7,137,011 | B1 | 11/2006 | Harari et al. |
| 7,162,569 | B2 | 1/2007 | Conley et al. |
| 7,237,046 | B2 | 6/2007 | Paley et al. |
| 7,237,074 | B2 | 6/2007 | Guterman et al. |
| 7,240,219 | B2 | 7/2007 | Teicher et al. |
| 7,595,682 | B2 * | 9/2009 | Lin et al. ............... 327/536 |
| 7,599,231 | B2 * | 10/2009 | Passerini et al. ......... 365/189.11 |
| 7,613,051 | B2 | 11/2009 | Cornwell et al. |
| 7,804,723 | B2 | 9/2010 | Hur et al. |
| 7,957,204 | B1 * | 6/2011 | Wu et al. ................ 365/189.09 |
| 2005/0052220 | A1 | 3/2005 | Burgener et al. |
| 2007/0014140 | A1 | 1/2007 | Telecco et al. |
| 2008/0123417 | A1 | 5/2008 | Byeon et al. |

\* cited by examiner

*Primary Examiner* — Fernando Hidalgo
(74) *Attorney, Agent, or Firm* — Meyertons, Hood, Kivlin, Kowert & Goetzel, P.C.

(57) ABSTRACT

Systems and methods, including computer software for performing operations enable interleaving of charging operations in a charging pump. A first charge pump is charged to a predetermined level, and a first operation is performed using a charge stored in the first charge pump after it reaches the predetermined level. A second charge pump is charged during a time that overlaps with performing the first operation. A second operation is performed using a charge stored in the second charge pump as a result of charging the second charge pump.

18 Claims, 5 Drawing Sheets

INTERLEAVING CHARGE PUMPS FOR PROGRAMMABLE MEMORIES

CLAIM OF PRIORITY

This application is a continuation application of and claims priority to U.S. patent application Ser. No. 13/188,302, filed on Jul. 21, 2011, which is a continuation of and claims priority to U.S. patent application Ser. No. 12/510,935, filed on Jul. 28, 2009, which is a divisional application of and claims priority under 35 USC §121 to U.S. Pat. No. 7,613,051, filed on Mar. 14, 2007, the entire contents of these applications are hereby incorporated by reference.

TECHNICAL FIELD

This description relates to electronic storage devices, and more particularly to interleaving charge pumps for programmable memories.

BACKGROUND

As computing devices have increased in capabilities and features, demand for data storage devices has grown. Data storage devices have been used, for example, to store program instructions (i.e., code) that may be executed by processors. Data storage devices have also been used to store other types of data, including audio, image, and/or text information, for example. Recently, systems with data storage devices capable of storing substantial data content (e.g., songs, music videos, etc. . . . ) have become widely available in portable devices.

Such portable devices include data storage devices (DSDs) that have small form factors and are capable of operating from portable power sources, such as batteries. Some DSDs in portable devices may provide non-volatile memory that is capable of retaining data when disconnected from the power source. Portable devices have used various non-volatile data storage devices, such as hard disc drives, EEPROM (electrically erasable programmable read only memory), and flash memory.

Flash memory has become a widely used type of DSD. Flash memory may provide a non-volatile memory in portable electronic devices and consumer applications, for example. Two types of flash memory are NOR flash and NAND flash. NOR flash typically provides the capacity to execute code in place, and is randomly accessible (i.e., like a RAM). NAND flash can typically erase data more quickly, access data in bursts (e.g., 512 byte chunks), and may provide more lifetime erase cycles than comparable NOR flash. NAND flash may generally provide non-volatile storage at a low cost per bit as a high-density file storage medium for consumer devices, such as digital cameras and MP3 players, for example.

In a wide array of devices, DSDs draw power from a voltage regulator designed to regulate a supplied voltage to a fixed level. In some applications, the voltage supplied to the DSD may be a convenient value such as 3.3V, 5V, or 12V, for example. The supplied voltage can be used by a charge pump to repeatedly store a relatively high voltage (e.g., 19V) for use in performing read or write operations on a programmable DSD.

SUMMARY

Techniques can be implemented to increase the power efficiency of charge pumps by decreasing the peak current drawn during charging of the charge pump. This increased efficiency can be particularly beneficial, for example, in devices that operate on battery power.

In one general aspect, a first charge pump is charged to at least a predetermined level, and a first operation is performed using a charge stored in the first charge pump after it reaches the predetermined level. A second charge pump is charged during a period that temporally overlaps with performing the first operation, and a second operation is performed using a charge stored in the second charge pump as a result of charging the second charge pump.

Implementations can include one or more of the following features. The first operation and the second operation can be performed on an electrically programmable memory. The electrically programmable memory can be a flash memory. The first operation or the second operation can involve writing data to the electrically programmable memory. A third charge pump is charged, and charging of the third charge pump can temporally overlap with charging of the first charge pump and/or the second charge pump. A third operation can be performed on the electrically programmable memory using a charge stored in the third charge pump as a result of charging the third charge pump.

The first operation and the second operation can deplete the charge stored in the first charge pump and the charge stored in the second charge pump, respectively. The first charge pump can be iteratively charged to at least the predetermined level, and the first operation can be performed after the first charge pump reaches at least the predetermined level. The second charge pump can be charged to at least the predetermined level, and the second operation can be performed after the second charge pump reaches at least the predetermined level. Each iteration of charging the second charge pump can temporally overlap with an iteration of performing the first operation, and each iteration of charging the first charge pump can temporally overlap with an iteration of performing the second operation. A different charging mode can be selected in response to at least one condition, and the different charging mode can include performing operations using only one of the first charge pump or the second charge pump; simultaneously charging the first charge pump and the second charge pump, such that operations performed using the first charge pump and the second charge pump do not temporally overlap with charging the first charge pump and charging the second charge pump; and/or altering a rate of charging of the first charge pump or the second charge pump.

In another general aspect, a first interleaving policy can be selected from multiple interleaving policies in response to a first condition, and one or more of the interleaving policies can involves interleaving corresponding functions among multiple charge pumps. A second interleaving policy can be selected from the multiple interleaving policies in response to a second condition.

Implementations can further include one or more of the following features. Interleaving can include sequentially charging the plurality of charge pumps. Interleaving can also involve sequentially performing operations using charges stored in the charge pumps. The interleaving policies control the operation of the charge pumps for programming or reading memory cells in an electrically programmable memory. The first condition and the second condition can relate to different power supply modes used for charging the charge pumps. Alternatively, the first condition can relate to use of the charge pumps for performing writing operations, and the second condition can relate to use of the charge pumps for performing reading operations. An association of the first interleaving policy with the first condition and an association of the second interleaving policy with the second condition can be based on a user-selected operating profile. The first interleaving policy and the second interleaving policy can result in drawing different levels of current for charging the charge pumps.

In yet another general aspect, a first charging policy can be selected in response to a first condition, and the first charging policy can enable charging one or more charge pumps at a first rate of charging. A second charging policy is selected in response to a second condition. The second charging policy can limit charging of the one or more charge pumps to a second rate of charging, and the second rate can be less than or more than the first rate.

Implementations can further include one or more of the following features. The second charging policy limits a current used to charge the one or more charge pumps. The one or more charge pumps are charged using the selected charging policy, and a read or write operation is performed on a flash memory using a charge stored in the one or more charge pumps.

In another general aspect, a system includes a memory having an array of memory cells, multiple charge pumps associated with the array of memory cells, and a processor operable to interleave operations of the charge pumps. Interleaving operations of the charge pumps involves charging a first charge pump during a time when a second charge pump is used to perform an operation on one or more of the memory cells. The performance of the operation results in a discharge associated with the second charge pump.

DESCRIPTION OF DRAWINGS

Like reference symbols in the various drawings indicate like elements.

DETAILED DESCRIPTION

Figure 1:
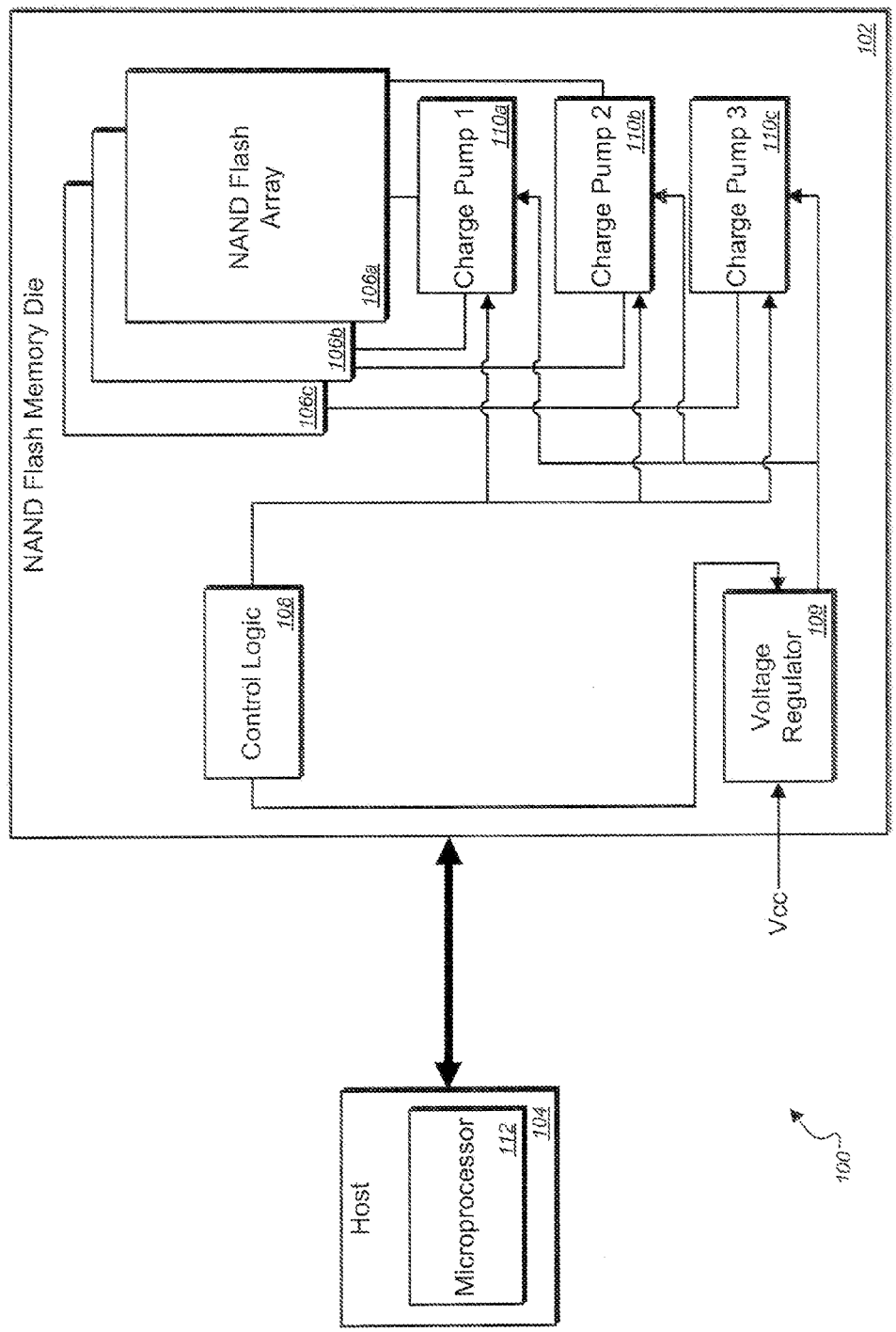
FIG. 1 is a block diagram of a portable flash memory device.

FIG. 1 shows an example of a system 100 such as a portable flash memory device. The system 100 may be, for example, an MP3 player, a cell phone, a PDA (portable digital assistant), a global positioning system, a portable processing device, a portable audio/visual recording device, a portable video player, or the like. The system 100 is capable of using or selecting among one or more charge pump interleaving policies. The interleaving policies can contain instructions to make use of one or more charge pumps to carry out flash memory operations, such as reading and writing to the memory or erasing the memory. For example, the interleaving policies can be used to control the operation of the charge pumps for writing or reading data stored in the flash memory device. In some implementations, interleaving two or more charge pumps can be utilized to allow for slower charging of the charge pumps by drawing less current, thereby increasing power efficiency while maintaining or improving memory performance in a flash memory device. By lowering the peak current draw, battery power may be preserved. Thus, such an interleaving policy may be preferred when a portable device is operating on battery power and/or when the battery has a low level of remaining charge. In some implementations, power efficiency can also be improved by simply limiting or controlling the rate of charging or current draw.

When using multiple charge pumps in a battery powered device, an interleaving policy may be selected that allows a first charge pump to perform a write operation while a second charge pump is charging. Once the first charge pump has completed the write operation or has been depleted of sufficient charge to perform further writing of data, the second charge pump can perform a write operation while the first charge pump is charging. The write operation may be performed to program a NAND flash memory with desired data.

As shown in FIG. 1, the system 100 includes a NAND flash memory die 102 and a host device 104. The NAND flash memory die 102 includes one or more NAND flash arrays 106a, 106b, and 106c, control logic 108, a voltage regulator 109, and one or more charge pumps 110a, 110b, and 110c. The NAND flash array 106a may be divided into a variety of blocks and pages that determine the smallest erasable entity in the NAND flash memory die 102. For example, the NAND flash array 106a may be divided into several pages of 128 kilobyte blocks, thereby defining the 128 kilobyte size as the smallest erasable entity on the device 102. This value is merely for illustration, and other page or block sizes can be used by the NAND flash memory device 102. In addition, although the NAND flash memory die 102 is illustrated as having three charge pumps 110 and three NAND flash arrays 106, other numbers of charge pumps (e.g., two or four) and/or NAND flash arrays (e.g., one, two, four, eight, or more) can be used. Furthermore, although this description focuses on the use of a NAND flash memory, the described techniques can also be applied to other types of memory that are electrically programmable (e.g., EPROM, EEPROM, and NOR Flash devices) and/or that use a charge pump to perform operations.

The NAND flash arrays 106a, 106b, and 106c store information in an array of floating gate transistors, known as cells. Information can be written to the cells using a tunnel injection method. The tunnel injection method may be invoked when the NAND flash array receives an instruction to write a cell. Tunnel injection injects electrons into an electric conductor through a thin layer of an electric insulator. For example, a voltage may be applied to the NAND flash array 106a, allowing an injection of electrons into a NAND flash memory cell, which results in data being stored in the cell. In particular, tunnel injection may be invoked because an external processor or host transmitted an instruction to the memory device, such as a "write-to-memory" instruction. The tunnel injection process is performed using a charge that is accumulated in a charge pump 110.

The control logic 108 operates to receive instructions, such as read, write, or erase instructions, from external processors, such as microprocessor 112, to enable data access operations on the NAND flash array 106a, 106b, or 106c. The control logic 108 may also receive an instruction to select a charge pump interleaving policy for charging and writing data to the NAND flash array 106a. The charge pump interleaving policy may include specifications detailing how fast to charge a particular charge pump (e.g., to limit the rate of charging), how many charge pumps to interleave, or how to utilize each particular charge pump.

For example, the charge pump interleaving policy can specify that a first charge pump charges while a second charge pump performs a write operation on the NAND flash array 106a, and as each completes their respective operations, the charge pumps switch operations, thereby cycling between writing and charging modes. The charge pump interleaving policy may also specify that charge pumps should operate without interleaving. For example, the interleaving policy may specify that each charge pump be used on a separate NAND flash array or on different parts of the same array. Another alternative may specify having the charge pumps perform operations sequentially using charges stored in each charge pump, where no overlap in charge pump operations occur on the NAND flash array 106a. In addition, an interleaving policy may allow multiple charge pumps to charge at any given time. For example, the charging of charge pumps can temporally overlap when instructed to do so. Alternatively, the charge pumps can charge simultaneously before performing operations. Another possible interleaving policy may involve using switching between two charge pumps for performing write operations and using a third charge pump in connection with confirming that correct values have been written to the cells.

The control logic 108 can also receive instructions to allow switching between charge pump interleaving policies. For example, the decision to switch to the charge pump interleaving policy may depend on the particular source of power utilized in the device. In some implementations, the use of battery power may be an indication to switch to charge pump interleaving to conserve battery life. In some implementations, the control logic 108 can receive instructions to select a first interleaving policy in response to one particular condition, and select a second interleaving policy in response to a second condition. In addition, the second condition may or may not be correlated to the first condition. There can be multiple different conditions that lead to selecting the first interleaving policy. An interleaving policy may also be selected based on the intended mode of operation of the charge pumps. For example, one condition may relate to using a first charge pump for performing write operations, while using a second charge pump to perform read operations in the same device. An interleaving policy may be selected from multiple interleaving polices in response to a combination of multiple conditions. In some implementations, the control logic 108 may be programmed to select an appropriate interleaving policy based on various conditions instead of receiving commands or instructions from a host microprocessor 112 to switch between interleaving policies.

As shown in FIG. 1, the voltage regulator 109 may be connected to a voltage source (Vcc) such as a battery, an alternating current (AC) supply, or a USB device, to name a few examples. The voltage regulator 109, which may be a linear regulator, a switch-mode DC-to-DC converter, and/or a low drop-out regulator, can maintain a constant voltage source for the NAND flash memory die 102. The regulated voltage source is applied at Vcc (FIG. 1) and supplied into one or more charge pumps (110a, 110b or 110c) until the charge pump reaches a desired voltage and/or a voltage is needed to perform one or more operations on the NAND flash memory array 106a, 106b, or 106c. The regulated voltage source may provide a source voltage within a range of voltages (e.g., 3.1-19.2 Volts) and/or may provide different voltages depending on the source (e.g., AC power vs. battery power). The identified values are merely for illustration, and not meant to limit the range of voltages that may be used. The control logic 108 may control operation of the voltage regulator 109 such that it provides a voltage at a selected level and/or for a selected interval.

The charge pumps 110a, 110b, and 110c are circuits that generate a voltage larger than the supply voltage Vcc (FIG. 1) from which they operate. As an example, a voltage multiplication of greater than twice the supply voltage can be achieved by cascading more than one capacitor in series in the charge pump circuit, although other techniques for generating higher voltage may be employed. The charge pumps in a NAND flash memory device generate the high voltage necessary to utilize tunnel injection methods where electrons are injected into each flash memory cell, thereby writing or erasing the data in the cell.

The charge pumps (110a-c) can operate in a continuous cycle of charging, writing, and reading until all received data has been written and verified, or until all charge has been depleted from the charge pump. Typically, the write operation begins with charging one or more charge pumps to a predetermined level using a particular charging policy, and then using the charge to perform the write operation in a NAND flash memory device. To verify the write occurred properly, the charge in the cell of the NAND flash memory device is tested using a read operation. The verification may involve testing to ensure a particular charge level is present in the cell. The write and read operations may continue until the memory device passes the testing. For example, charge pump 110a may write data to a cell, read back the amount of charge in the cell, and compare the charge in the cell with the charge level corresponding to the desired bit or bits to be stored in the cell. If the charge levels are incorrect for one or more of the cells, the charge pump 110a can be used to perform the write operation again until the correct level is verified.

Charge pumps may be interleaved to perform read, write, and erase operations. They can also operate independently from one another in the NAND flash memory die 102. Interleaved charge pumps can increase or decrease the speed in which operations are performed on the NAND flash memory die 102 depending on the interleaving policy selected. Interleaved charge pumps can also increase or decrease the power efficiency of the NAND flash memory die 102 depending on the interleaving policy selected. In some implementations, adding or interleaving multiple (e.g., three or more) charge pumps may allow for increased power performance in the NAND flash memory device. For example, in system 100, a first charge pump 110a may write to one portion of the memory 102, while a second charge pump 110b is charging. When the second charge pump 110b has completed charging, it can write to the memory 102 while the first charge pump 110a returns to charging. The charge pumps 110a and 110b in this example may charge more slowly and draw a lower peak current relative to a system that uses a single charge pump, while maintaining approximately the same writing performance rates because additional charge pump resources are made available to carry out the writing task.

In some implementations, multiple charge pumps may be used to obtain faster write speeds than a system using a single charge pump. Charge pumps may also be used simultaneously in separate flash memory dies, where interleaving of charge pumps does not occur, yet more operations can be completed in less time, since each charge pump is assigned to one flash memory die. For example, a single charge pump may be assigned for each NAND flash array 106a, 106b, and 106c, allowing writing to occur on multiple NAND flash arrays at one time, each utilizing one assigned charge pump. In some cases, multiple charge pumps may be assigned to one NAND flash array and allowing charge pump operations to overlap in a single NAND flash device. For example, charge pump 110a can begin writing while charge pump 110b completes a write operation and switches to a read operation, thereby overlapping the two operations. In addition, charge pumps may not all need to be active at one time. For example, four NAND flash arrays may each contain two charge pumps, but operations on the arrays may be performed using only a subset of the charge pumps (e.g., four of the total eight charge pumps).

In some implementations, the charge pumps may be external to a memory device. For example, the charge pump circuitry may be located on a substrate external to the memory device packaging, such as in or around control logic circuitry (e.g., located on the host device 104 instead of on the NAND flash memory die 102). Alternatively, some charge pumps may be internal to the memory device, while other charge pumps operating on the system remain external to the memory device.

In some implementations, an interleaving policy may be selected where at least some charging of each charge pump occurs simultaneously. For example, charging of the charge pumps may be overlapped or staggered to increase power efficiency for each charge pump. Alternatively, an interleaving policy may be selected where charging can occur sequentially. For example, the operations can be performed on one NAND flash array using two or more charge pumps that are charged sequentially. Therefore, operations can be performed on demand without waiting for a charge pump to complete charging or re-charging. This may be particularly helpful in a flash memory device that is constantly or frequently updated with new information.

As shown in FIG. 1, the host device 104 includes a microprocessor 112. The microprocessor 112 is capable of retrieving and executing software instructions stored on the NAND flash memory die 102 or on some other storage device. The microprocessor 112 can also, or alternatively, transmit instructions or commands to, and retrieve data from the NAND flash memory die 102. For example, the host device 104 can transmit a write command and a memory address destination to the NAND flash memory die 102 to write data to the NAND flash memory die 102. The host device 104 can also transmit a read command and a page address to the NAND flash memory die 102 to retrieve a particular memory page in the NAND flash memory die 102. Further, the host device 104 can transmit an interleave charge pump command to the control logic 108 to begin using multiple charge pumps during read and write operations, or alternatively, send a command to shut down specific charge pumps. In some implementations, the microprocessor 112 can more directly control the interleaving of the charge pumps (i.e., without reliance upon the control logic 108), which can be located either on the NAND flash memory die 102 or external to the NAND flash memory die 102 (e.g., on the host device 104). The microprocessor 112 may execute software that controls read, write, and erase operations in the NAND flash array 106a.

Typically, the control logic 108 has limited functionality compared to the microprocessor 112. For example, the control logic may only include functionality necessary to access cells or write to cells under the control of the microprocessor 112. In some implementations, however, the control logic 108 on the NAND flash die 102 may perform more extensive functions, such as translating direct commands from the host device 104.

Figure 2:
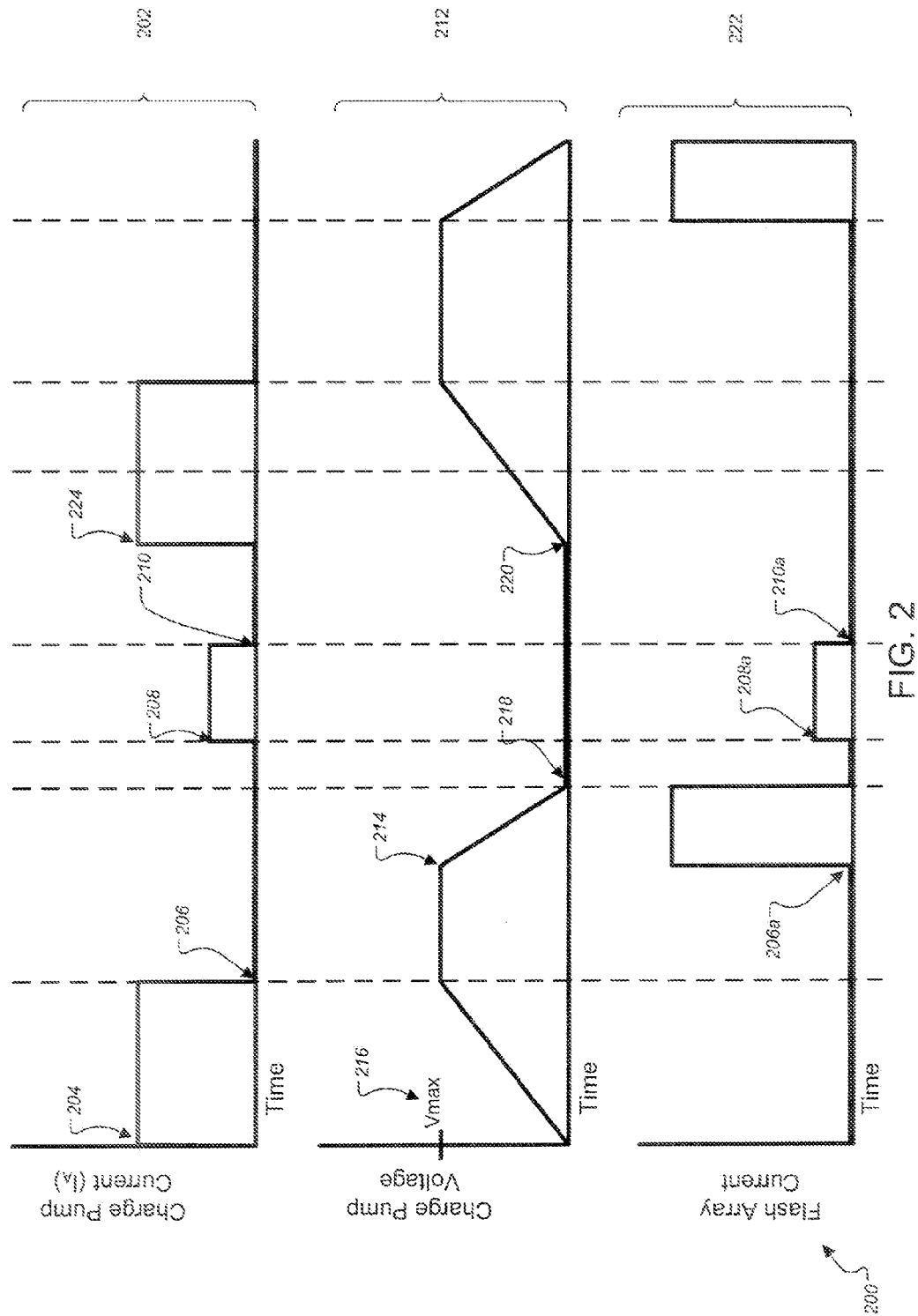
FIG. 2 is a timing diagram showing the operation of a charge pump circuit in a NAND flash memory device.

FIG. 2 is a timing diagram 200 showing the operation of a charge pump circuit in a NAND flash memory device during a write operation. The timing diagram illustrates various voltage and current levels during write and read operations as the charge pump 110a is performing operations on the NAND flash array 106a, 106b, or 106c. The timing diagram 202 depicts the operating charge pump current ($I_A$) (e.g., the current on the $V_{CC}$ rail that supplies voltage to the charge pump) in the NAND flash array 106a versus time. The supply voltage can be applied to the charge pump 110a, thereby drawing a relatively high amount of current into the charge pump 106a causing the charge pump to begin charging (beginning at 204). As a result of the current drawn from the voltage supply, the charge pump begins to accumulate charge and, as a result, stores voltage in the charge pump that can be used to carry out NAND flash array operations. For example, when a predetermined amount of voltage has been accumulated in the charge pump 106a, the charge pump 110a may stop drawing current (as indicated at 206). At the same time or at some later time, the system 100 can also allow current to flow from the charge pump to the NAND flash array 106a for use in performing a write operation. The current level may be reached slowly or jump abruptly depending on the operating conditions.

The writing process may continue until the charge in the charge pump is depleted. In some implementations, a read operation can occur after completion of the write operation to verify that the write operation was successful (i.e., that the write operation resulted in an appropriate level of charge being stored in the charge pump). In some implementations, the charge pump 110a may not require charging to perform the read operation; nevertheless, a current may be drawn through the charge pump 110a to carry out the read operation (as indicated at 208). Once the read operation is complete, the current drawn from the voltage supply once again drops (as indicated at 210). The sequence of writing followed by a verification read operation can be performed iteratively to ensure data has been properly programmed into the NAND flash array 106a.

The voltage stored within the charge pump is also shown in the diagram 200 (as indicated at 212). As current is drawn into the charge pump, the accumulated voltage can increase up to a predefined maximum voltage (Vmax) 216, and may then remain constant until an operation that draws current from the charge pump is performed in the NAND flash memory die 102 (e.g., beginning at 214). During performance of a write operation, for example, the NAND flash memory die 102 can drop from a maximum voltage level (at 214) to some minimum voltage level (at 218) as the capacitors in the charge pump electrostatically discharge and current flows into the NAND flash array 106a. The voltage may remain low until the charge pump 110a begins another cycle of charging by drawing current (as indicated at 224) and accumulating charge (as indicated at 220).

The current flowing from the charge pump into the NAND flash array current is shown in the diagram 200 (as indicated at 222). The diagram 222 shows the current flowing into the NAND flash array during writing and reading operations. When the write operation begins at 206a, the current flowing into the NAND flash array 106a rises to a relatively constant level causing the voltage in the charge pump to dissipate over time (from 214 to 218), for example. In some implementations, the level of current flowing into the flash array when performing operations on the NAND flash array 106a may be higher or lower than the level of current flowing into the charge pump during charging. In addition, the current necessary to read back a value from the NAND flash array 106a may be higher or lower than the current used to charge the charge pump. The current used to perform a read operation to verify the preceding write operation may be the same (as indicated at 208a and 210a) as the current flowing into the charge pump (as indicated at 208 and 210) because the current may simply flow through the charge pump. Although only two cycles of read and write are depicted in FIG. 2, the process can include several cycles and can be repeated iteratively until all charge has been depleted.

Figure 3:
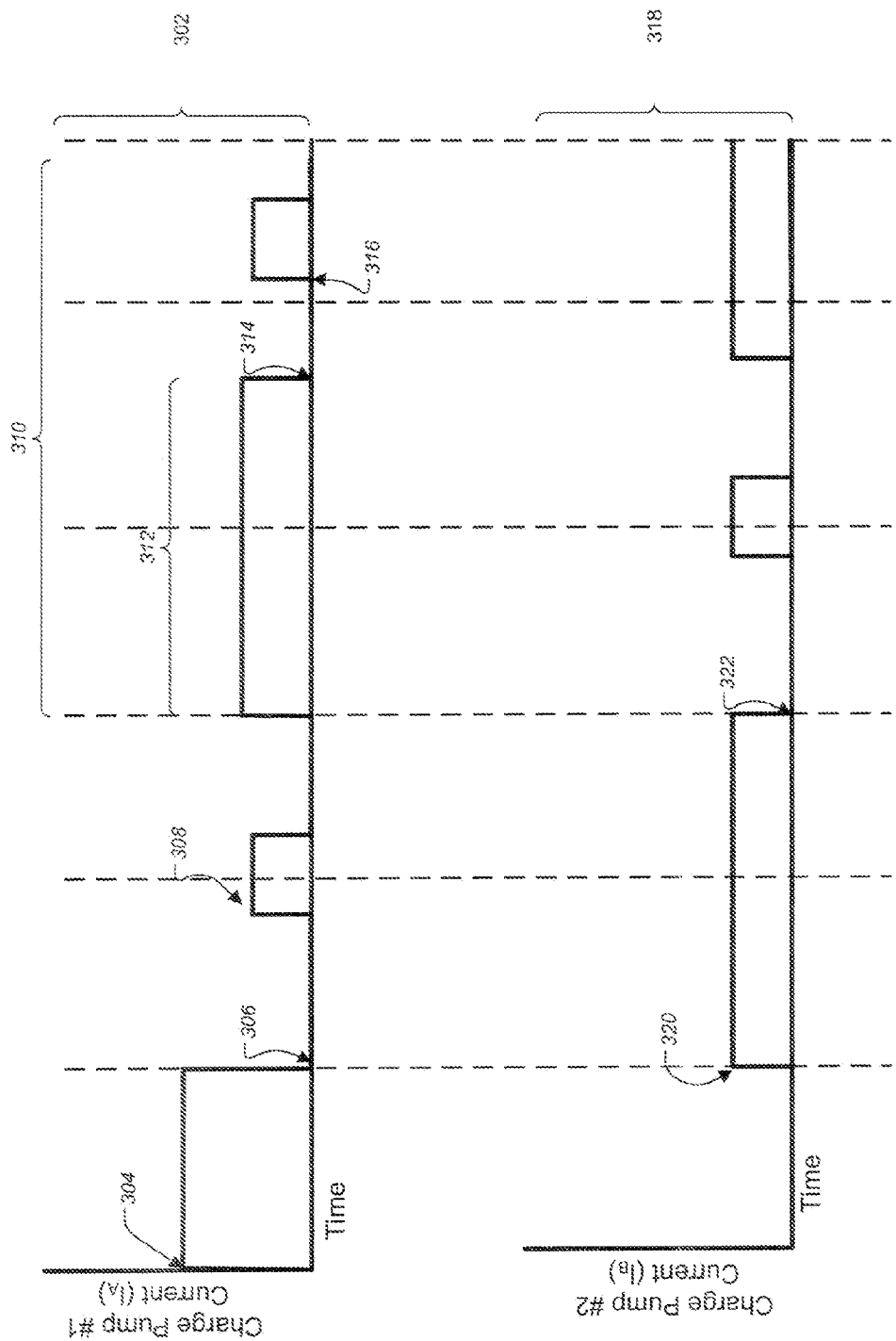
FIG. 3 is a timing diagram showing the operation of the system of FIG. 1 in accordance with an interleaving policy.

FIG. 3 is a timing diagram showing the operation of the system of FIG. 1 in accordance with a variety of interleaving policy examples. The timing diagram shows write and read operations for two charge pumps. In this example, the diagram shows operations for two charge pumps, but other quantities of charge pumps can operate in accordance with one or more interleaving policies at any given time. In some implementations, the operations can occur on the different charge pumps simultaneously or alternatively can occur sequentially. The timing diagram (at 302) depicts the operating current ($I_A$) flowing into the charge pump 110a over time. The operations depicted in FIG. 3 may be the result of receiving a command from the host microprocessor 112. For example, the host microprocessor 112 may send a command to the NAND flash die 102 to perform a standard write operation using a first charge pump 110a. The diagram shows current flowing into the first charge pump 110a to perform charging (beginning at 304) until the charge pump 110a reaches a maximum voltage level (see FIG. 2). In some implementations, the charge pump current can rise immediately depending on the interleave policy selected, and alternatively can rise slower than the diagram 302 depicts.

The charge pump 110a remains charged until a command is received to write to the NAND flash array 106a. In the timing diagram 302, a write command may be received, for example, at 306, causing a gradual (or rapid, depending on the amount of current required to perform the writing operations) depletion of the charge stored in the charge pump as the write operation occurs on the memory device 106a (see FIG. 2). The write operation can be verified by a read operation beginning at 308, in which case current again flows into and through the first charge pump 110a. The first charge pump 110a can begin charging again to repeat the write/read cycle. Alternatively, the charge pump may receive a command to switch to a different interleaving policy. For example, a charging sequence may be performed slower, using less current over a longer period of time. For example, the write and read cycle, shown from arrow 304 to arrow 308 can be performed slower, such as shown at 310. The cycle shown at 310 uses a lower peak current to charge the charge pump 110a (at 312) compared to the charging that begins at 304 but performs the charging over a longer period of time. The writing operation can be performed beginning at 314 or sometime thereafter, and a read operation (i.e., to confirm that the data is correctly written) can be performed beginning at 316.

The timing diagram 318 depicts the operating current ($I_B$) flowing into the second charge pump 110b over time. The second charge pump 110b can operate on the same NAND flash array 106a that the first charge pump 110a operates on, or can operate on a different array. In this example, the first charge pump 110a begins charging at a first rate, while the second charge pump 110b may charge at a second rate. After the first charge pump 110a reaches a predetermined level of charge, a first operation may be performed. For example, a write operation may occur beginning at 306 or sometime thereafter. At approximately the same time, charging of the second charge pump 110b may begin at 320. Upon charging to a predetermined level, the charge stored in the second charge pump 110b can be used to write data to the NAND flash array 106a beginning at 322 or sometime thereafter, causing the depletion of charge from the second charge pump 110b. Therefore, each charging mode can temporally overlap the performance of an operation in one or more charge pumps. In other words, charging of the first charge pump 110a can be performed while using the second charge pump 110b to perform writing operations, and vice versa. Alternatively, in accordance with a different interleaving mode, charging modes may not overlap each other, but may charge simultaneously. As shown in FIG. 3, charging modes for the charge pumps in a NAND flash memory die 102 can be controlled to alter the rate and frequency of charging and current draw under the control of a processor or other device, which can select among different interleaving modes.

In some implementations, the performance time of write and read operations can be modified depending on the interleaving policy selected. In addition, the timing of operations, can be adjusted, controlled, or modified by an external processor, such as microprocessor 112. As shown by arrow 314, the write operation can complete, followed by another verification read beginning at 316, and charging can begin again using the currently selected interleaving policy. Generally, a charge pump interleaving policy is not changed in the middle of a charging cycle, but in some implementations, the charge pump can receive a new interleaving policy during a write operation, thereby changing policies after a cycle has completed.

In some implementations and/or in accordance with alternative interleaving policies, the system 100 may receive instructions to continue operating with one charge pump, or to begin interleaving one or more charge pumps. Utilizing additional charge pumps in a flash memory device may allow for a slower charge rate, which corresponds to a lower peak current during charging. In addition, increasing the number of charge pumps can enable operations to take less time to perform. For example, system 100 can write data on two pages of memory at a time using two or more charge pumps and still keep the total current draw lower than if the system 100 were using one charge pump.

In some implementations, one charge pump may be used to read or write to one NAND flash array, while a second charge pump may be used to read or write to another NAND flash array. Moreover, several charge pumps may be used with multiple NAND flash arrays in a single flash memory die. In addition, multiple charge pumps may also be used to write to different portions of a single NAND flash array. For example, charge pump 110a can be used to write to one or more pages in the array 106b. A second charge pump, such as charge pump 110b can also be used to write to a different set of pages on the array 106b.

The system 100 may also use multiple charge pumps that may be assigned various rates of charging. For example, the host 104 may assign one charge pump 110a to charge at a slower rate than another charge pump 110b. In alternative implementations, the flash memory device may receive a command to interleave charge pumps that charge at a specific rate to improve the power efficiency when performing memory operations.

Interleaving policies for charge pumps can be configured based on desired performance, power efficiency, or mode of operation, and the like. An interleaving policy can be selected to enhance performance of the NAND flash memory device. For example, specific charge pump profiles can be configured for a memory device regarding charge pump usage. In some implementations, the profile may be assigned to utilize all available charge pumps to accomplish a particular operation. For example, when a user wishes to upload a large amount of data to a memory device, all charge pumps can be interleaved to accomplish the writing task. Alternatively, a charge pump profile can include using as few charge pumps as possible to perform an operation, such that the least amount of power is consumed on the device.

In some implementations, different densities of interleaving may occur. For example, the interleaving policy can allow multiple charge pumps to operate in parallel for a particular flash memory on identical timing schedules, or on different timing schedules. Alternatively, multiple charge pumps may be operated serially in the same manner, and may operate on one or more flash memories at a time. For example, the interleaving policy can send a command to a first charge pump to begin operations, and wait a specific time period before sending a command to begin operations in a second charge pump.

Interleaving policies may be based on user-selectable conditions, such as a particular power profile. For example, a user may choose a battery conservation mode, which causes the device to operate using a particular interleaving policy when operating on battery power. In addition, the interleaving policy can be configured to use simultaneous charging circuitry, which pumps a gate voltage with low current, to increase write and erase speeds when on an external power source. In some implementations, different policies may be selected for write operations, read operations, and erase operations.

Figure 4:
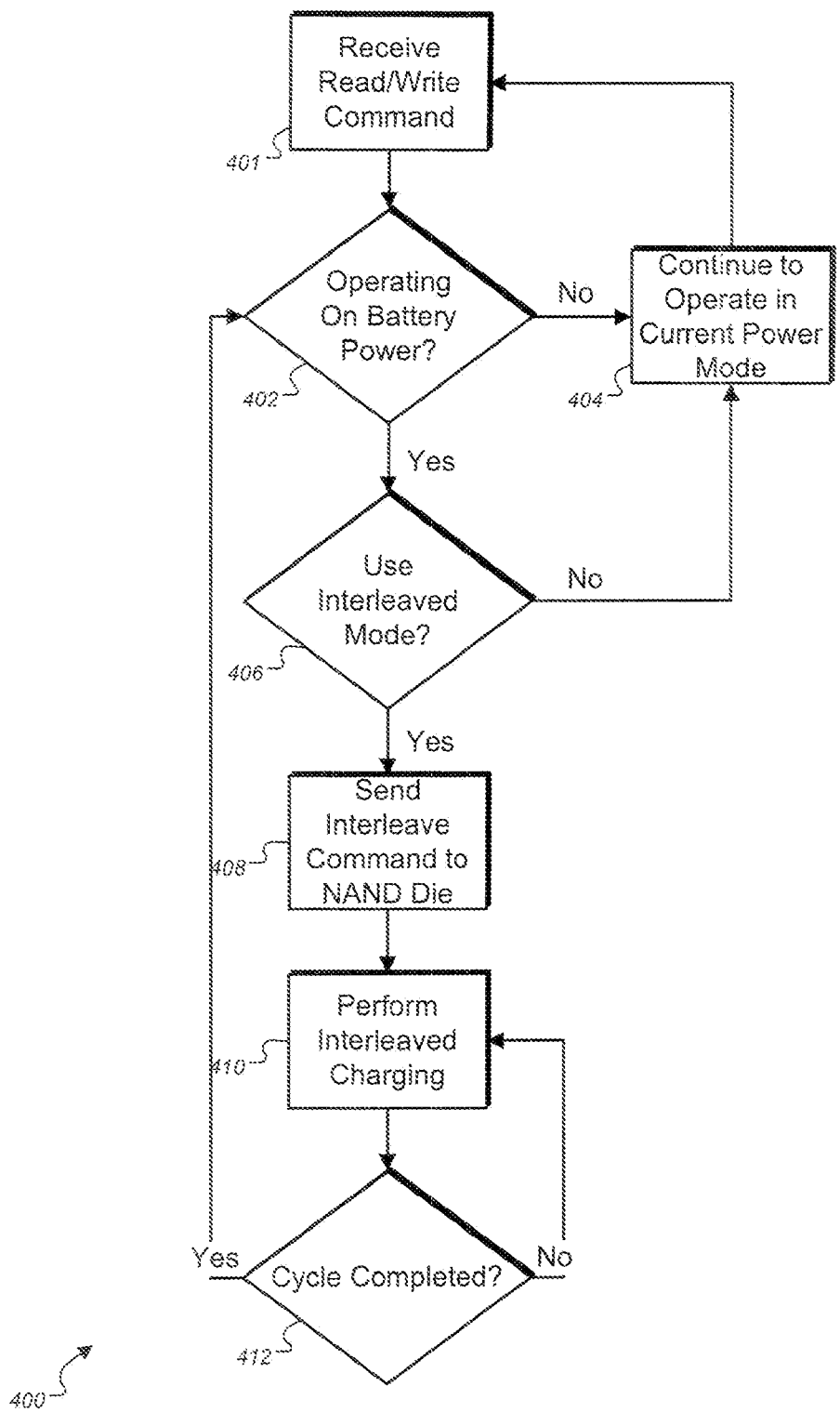
FIG. 4 is a flow diagram of a process for selecting a charge pump interleaving policy in a portable flash memory device.

FIG. 4 is a flow diagram of a process for selecting a charge pump interleaving policy in a portable flash memory device. Typically, the process 400 is performed continuously to allow for continuous adjustments, although the process 400 can also be initiated periodically (e.g., at time intervals) or iteratively (e.g., in a looped manner). For example, the host device 104 may use the host microprocessor 112 to determine (402) if the flash memory device is operating on battery power. In some situations, the device may be operating on standard alternating current (AC) power, and therefore may not require additional charge pumps to increase power efficiency. In those situations where standard AC power is available, the flash memory device may continue to operate (404) in the current or ongoing power mode when power conservation is not a concern. Alternatively, the microprocessor 112 may determine (402) the flash memory device is currently operating on battery power, and therefore the microprocessor 112 decides whether or not to switch to an interleaved mode. In some implementations, the microprocessor may decide (at 406) not to switch to the interleaved mode based on certain parameters (e.g., if the user has selected a power profile that precludes the interleaved mode).

If the microprocessor decides (at 406) to switch to the interleaved mode, an interleave charge pump command may be sent (at 408) to the NAND flash memory die 102. The command may include an instruction to place the NAND flash memory die 102 into the interleaved mode. The interleaved mode may be used during read and write operations to increase the efficiency of power consumption from the portable flash memory device. The portable flash memory device may perform (410) interleaved charging until the end of a read or write cycle (e.g., all of the data to be read or written has been retrieved from or stored to the NAND flash). The microprocessor 112 may determine (412) whether or not a read or write cycle has completed. If the read or write cycle has not completed, the microprocessor 112 continues to perform (410) interleaved charging. Upon completion of the read or write cycle, the method 400 may return to inquiring (402) whether or not the device power source or other conditions have been modified since the cycle began.

Figure 5:
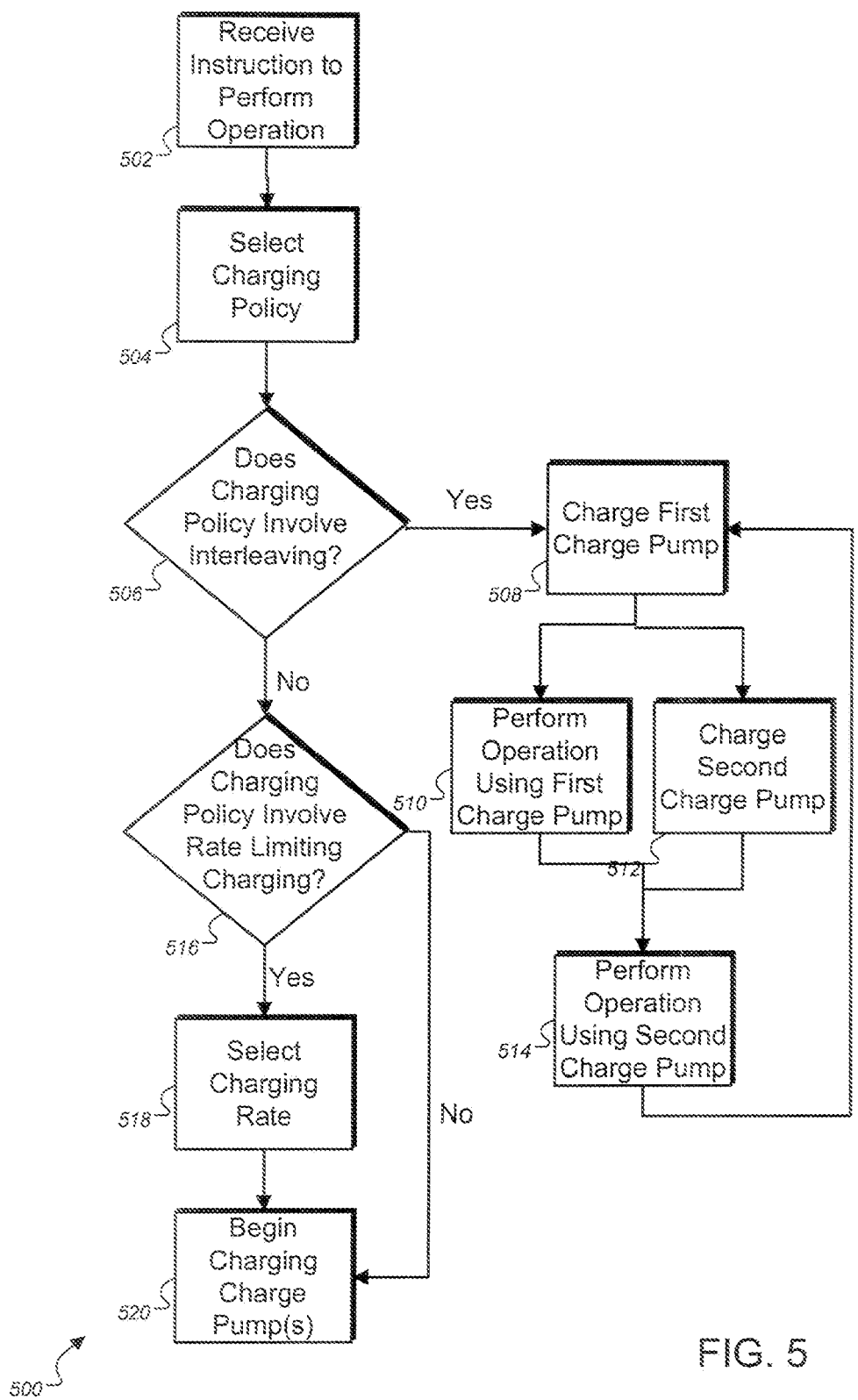
FIG. 5 is a flow diagram of a process for selecting a charge rate in a charge pump circuit.

FIG. 5 is a flow diagram of a process for selecting a charge rate in a charge pump circuit. The process 500 can begin when an instruction is received (502) to perform an operation (e.g., a write operation). A charging policy is selected (504). The charging policy can be selected from multiple available charging policies and can define a maximum and/or average current draw, an amount and/or degree of interleaving, and/or other characteristics or parameters for performing charging in the charge pump circuit. In this example, it is determined (506) whether the charging policy involves interleaving of multiple charge pumps. If so, a first charge pump is charged to at least a predetermined level (508), and a reading, writing, erasing, or other operation is performed (e.g., on an electrically programmable memory) using the charge that is accumulated in the first charge pump (510). Generally, such operations can be performed immediately after or some time following the accumulation of charge in the first charge pump and result in a depletion of the accumulated charge. It is noted that in some implementations, interleaved charging and performance of operations can also involve limiting the rate of charging, in which case a charging rate may be selected prior to beginning to charge the first charge pump (at 508).

At least partially overlapping in time with the performance of an operation using the first charge pump, a second charge pump is charged to at least a predetermined level (512), and a reading, writing, erasing, or other operation is performed using the charge that is accumulated in the second charge pump (514). The operation performed using the second charge pump can be the same or different than the operation performed using the first charge pump. Furthermore, the operation performed using the second charge pump (514) can be performed at the same time as, or partially overlapping in time with another iteration of charging the first charge pump (508). Thus, multiple iterations of interleaved charging and performing operations can be used. In some cases, a third charge pump can also be charged at least partially overlapping in time with charging of the first charge pump or the second charge pump, and the charge accumulated in the third charge pump can be used to perform an operation on the electrically programmable memory.

If it is determined (at 506) that the charging policy does not involve interleaving, a determination can be made as to whether the charging policy involves rate limiting charging (516). If so, a charging rate can be selected (518), and charging of one or more charging pumps can begin (520). In some implementations, if a change in conditions (e.g., a change in the power mode, a user selection of a different power profile, a change in types of operations being performed, etc.) occurs, a different charging mode can be selected, in which case the process 500 can involve selecting a new charging policy (504). In some cases, the change in charging policies can occur in the middle of an iterative sequence of operations, while in other cases the change may occur after a set of operations are complete. The change in charging policies can result, for example, in performing operations using only the first charge pump or the second charge pump; simultaneously charging the first charge pump and the second charge pump (e.g., such that operations performed using the first charge pump and the second charge pump do not temporally overlap with charging the first charge pump and charging the second charge pump); and altering a rate of charging of the first charge pump and/or the second charge pump.

The invention and most of the functional operations described in this specification can be implemented in digital electronic circuitry, or in computer software, firmware, or hardware, including the structural means disclosed in this specification and structural equivalents thereof, or in combinations of them. The invention can be implemented as one or more computer program products, i.e., one or more computer programs tangibly embodied in an information carrier, e.g., in a machine readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the invention, can be performed by one or more programmable processors executing one or more computer programs to perform functions of the invention by operating on input data and generating output. Portions of the processes and logic flows can also be performed by, and apparatus of the invention can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, the processor will receive instructions and data from a read only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Information carriers suitable for embodying computer program instructions and data include all forms of nonvolatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. In some implementations, the described processes and techniques may be limited to use in connection with NAND flash memories or other nonvolatile memories in which individual memory locations are not separately addressable. The processor and the memory can be supplemented by, or incorporated in, special purpose logic circuitry.

To provide for interaction with a user, the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

A number of implementations have been described. Nevertheless, it will be understood that various modifications may be made. For example, in some cases, operations can be performed in a different order than that described and shown in the Figures. In addition, the techniques can be used in connection with nonvolatile memories other than NAND flash memories, such as other memories in which data typically cannot be randomly accessed and/or retrieved on a byte-by-byte basis. Accordingly, other implementations are within the scope of the following claims.

The invention claimed is:

1. A method for interleaving charging operations, the method comprising:
    performing an operation on a non-volatile memory to program a plurality of pages in the non-volatile memory, wherein performing the operation on the non-volatile memory includes:
        using charge stored in a first charge pump coupled to the non-volatile memory to program a first subset of the plurality of pages; and
        using charge stored in a second charge pump coupled to the non-volatile memory to program a second subset of the plurality of pages.

2. The method of claim 1, further comprising charging the second charge pump while using the charge stored in the first charge pump.

3. The method of claim 1, further comprising charging the second charge pump and the first charge pump, wherein the charging of the of the second charge pump overlaps the charging of the first charge pump.

4. The method of claim 1, wherein the non-volatile memory comprises a flash memory.

5. The method of claim 1, further comprising:
    charging a third charge pump while using the charge stored in the second charge pump, the third charge pump coupled to the non-volatile memory; and
    using charge stored in the third charge pump to program a third subset of the plurality of pages.

6. The method of claim 1 further comprising selecting a different charging mode in response to an event, wherein the different charging mode comprises at least one of:
    performing programming operations using only one of the first charge pump or the second charge pump;
    simultaneously charging the first charge pump and the second charge pump, wherein programming operations performed using the first charge pump and the second charge pump do not overlap with charging the first charge pump and charging the second charge pump; or
    altering a rate of charging of at least one of the first charge pump or the second charge pump.

7. A computer-readable, non-transitory storage medium comprising program instructions executable by one or more processors to perform an operation on a nonvolatile memory to program a plurality of pages in the non-volatile memory, wherein performing the operation on the non-volatile memory comprises:
    using charge stored in a first charge pump coupled to the non-volatile memory to program a first subset of the plurality of pages; and
    using a charge stored in a second charge pump coupled to the non-volatile memory to program a second subset of the plurality of pages.

8. The computer-readable, non-transitory storage medium of claim 7, further comprising program instructions for charging the second charge pump while using the charge stored in the first charge pump.

9. The computer-readable, non-transitory storage medium of claim 7, further comprising program instructions for charging the second charge pump and charging the first charge pump, wherein the charging of the of the second charge pump overlaps the charging of the first charge pump.

10. The computer-readable, non-transitory storage medium of claim 7, wherein the non-volatile memory comprises a flash memory.

11. The computer-readable, non-transitory storage medium of claim 7, further comprising program instructions for:
 charging a third charge pump while using the charge stored in the second charge pump, the third charge pump coupled to the non-volatile memory; and
 using charge stored in the third charge pump to program a third subset of the plurality of pages.

12. The computer-readable, non-transitory storage medium of claim 7, further comprising program instructions for selecting a different charging mode in response to an event, wherein the different charging mode includes at least one of:
 performing programming operations using only one of the first charge pump or the second charge pump;
 simultaneously charging the first charge pump and the second charge pump, wherein programming operations performed using the first charge pump and programming operations performed using the second charge pump do not overlap with charging the first charge pump and charging the second charge pump; or
 altering a rate of charging of at least one of the first charge pump or the second charge pump.

13. A non-volatile memory, including:
 a non-volatile memory array comprising a plurality of pages for storing data;
 a plurality of different charge pumps coupled to the non-volatile memory array, wherein the plurality of different charge pumps includes at least a first charge pump and a second charge pump; and
 a controller configured to perform an operation on the non-volatile memory array, wherein to perform the operation on the non-volatile memory array, the controller is further configured to:
  use charge stored in the first charge pump to program a first subset of the plurality of pages; and
  use charge stored in the second charge pump to program a second subset of the plurality of pages.

14. The non-volatile memory of claim 13, the controller further configured to charge the second charge pump and charge the first charge pump, wherein the charging of the second charge pump overlaps the charging of the first charge pump.

15. The non-volatile memory of claim 13, wherein the non-volatile memory comprises flash memory.

16. The non-volatile memory of claim 13, wherein the controller is further configured to charge the second charge pump while using the charge stored in the first charge pump.

17. The non-volatile memory of claim 13, wherein the controller is further configured to:
 charge a third charge pump while using the charge stored in the second charge pump; and
 use charge stored in the third charge pump to program a third subset of the plurality of pages.

18. The non-volatile memory of claim 13, wherein the controller is further configured to select a different charging mode in response to an event, wherein the different charging mode includes at least one of:
 performing programming operations using only one of the first charge pump or the second charge pump;
 simultaneously charging the first charge pump and charging the second charge pump, wherein programming operations performed using the first charge pump and programming operations performed using the second charge pump do not overlap with charging the first charge pump and charging the second charge pump; or
 altering a rate of charging of at least one of the first charge pump or the second charge pump.

* * * * *